(12) United States Patent
Yamashita et al.

(10) Patent No.: US 10,516,105 B2
(45) Date of Patent: Dec. 24, 2019

(54) RESISTIVE MEMORY DEVICE CONTAINING OXYGEN-MODULATED HAFNIUM OXIDE MATERIAL AND METHODS OF MAKING THEREOF

(71) Applicant: SANDISK TECHNOLOGIES LLC, Plano, TX (US)

(72) Inventors: Kosaku Yamashita, Yokkaichi (JP); Yoshihiro Sato, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 102 days.

(21) Appl. No.: 15/682,935

(22) Filed: Aug. 22, 2017

(65) Prior Publication Data
US 2019/0067568 A1    Feb. 28, 2019

(51) Int. Cl.
*H01L 45/00* (2006.01)
*H01L 27/24* (2006.01)

(52) U.S. Cl.
CPC ........ *H01L 45/1233* (2013.01); *H01L 27/249* (2013.01); *H01L 27/2463* (2013.01); *H01L 27/2481* (2013.01); *H01L 45/04* (2013.01); *H01L 45/145* (2013.01); *H01L 45/146* (2013.01); *H01L 45/1608* (2013.01); *H01L 45/1616* (2013.01); *H01L 45/1633* (2013.01)

(58) Field of Classification Search
None
See application file for complete search history.

(56) References Cited

U.S. PATENT DOCUMENTS

| | | |
|---|---|---|
| 5,340,763 A | 8/1994 | Dennison |
| 8,724,369 B2 | 5/2014 | Zhang et al. |
| 2013/0043455 A1 | 2/2013 | Bateman |
| 2013/0221307 A1* | 8/2013 | Wang ............... H01L 45/10 257/2 |
| 2013/0320285 A1* | 12/2013 | Zhou ............... H01L 45/04 257/2 |
| 2014/0239365 A1* | 8/2014 | Lee ............... H01L 29/66825 257/316 |
| 2014/0367631 A1* | 12/2014 | Govoreanu ........ G11C 13/0002 257/4 |

(Continued)

FOREIGN PATENT DOCUMENTS

| | | |
|---|---|---|
| JP | 2012-180536 A | 9/2012 |
| WO | WO2007/004843 A1 | 1/2007 |

OTHER PUBLICATIONS

Govoreanu et al., "10x10nm² Hf/HfO$_x$ Crossbar Resistive RAM with Excellent Performance, Reliability and Low-Energy Operation," IEDM(2011), pp. 730-732.

(Continued)

*Primary Examiner* — Charles D Garber
*Assistant Examiner* — Xiaoming Liu
(74) *Attorney, Agent, or Firm* — The Marbury Law Group PLLC

(57) ABSTRACT

A resistive memory device includes a first electrode, a second electrode spaced from the first electrode along a spacing direction, and a hafnium oxide resistive material portion of a resistive memory cell located between the first electrode and the second electrode and having a compositional modulation in oxygen concentration within directions that are perpendicular to the spacing direction.

21 Claims, 17 Drawing Sheets

(56) References Cited

U.S. PATENT DOCUMENTS

2017/0077184 A1   3/2017   Kikuchi et al.

OTHER PUBLICATIONS

Molina et al., "Resistive Switching Characteristics of MIM Structures based on Oxygen-Variable Ultra-Thin $HfO_2$ and Fabricated at Low Temperature," Materials Science in Semiconductor Processing 66 (2017) pp. 191-199.

* cited by examiner

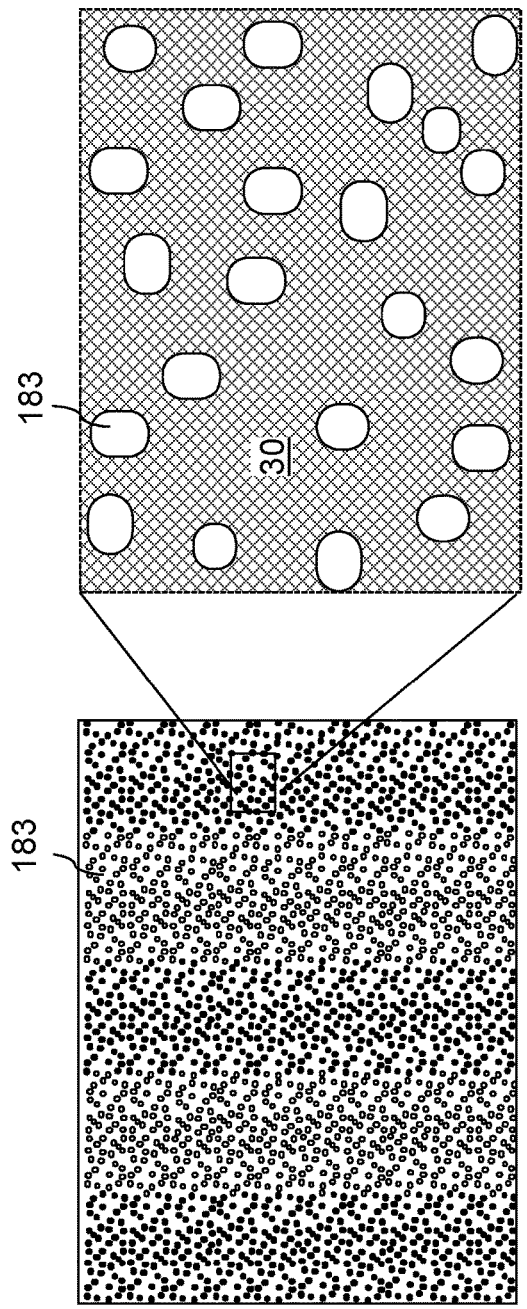
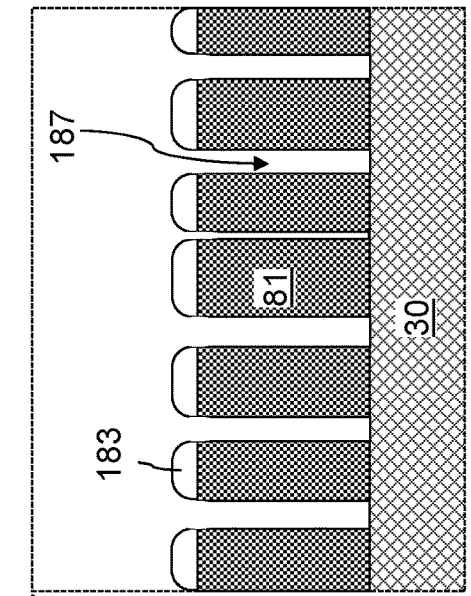
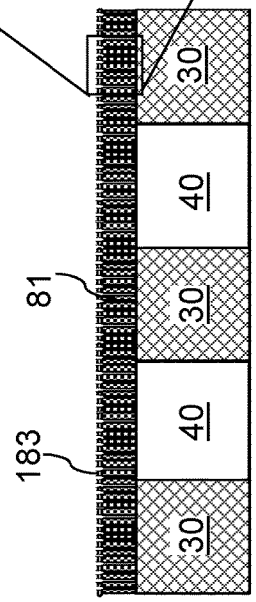
FIG. 6A
FIG. 6B

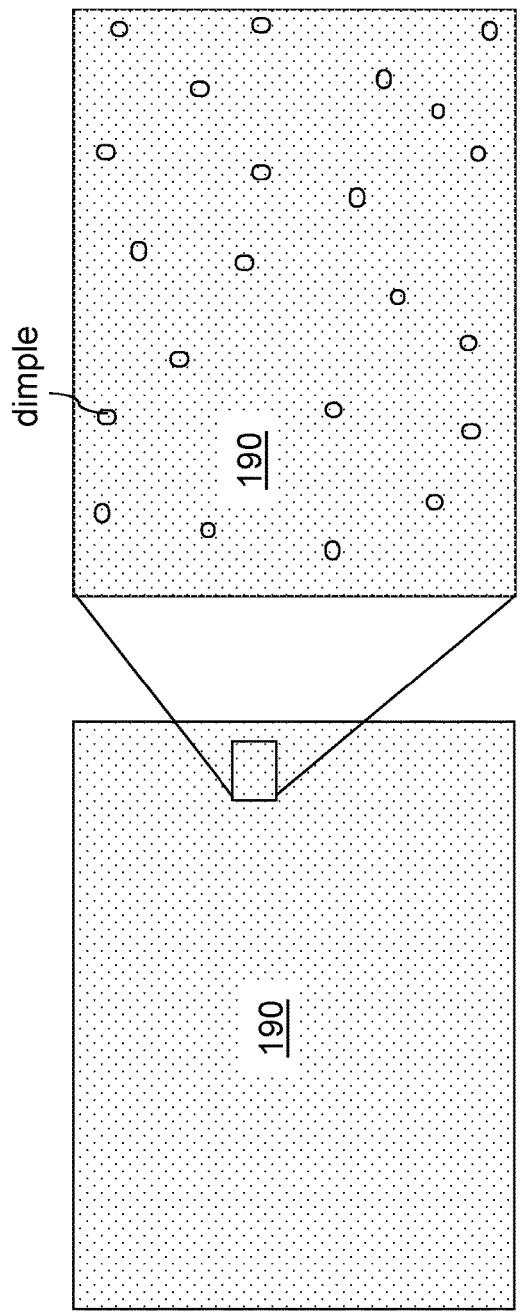
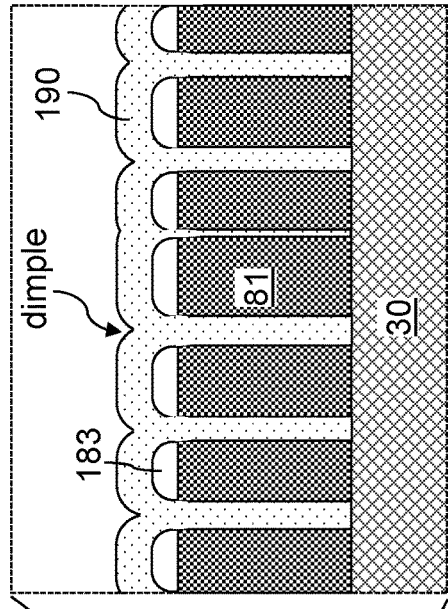
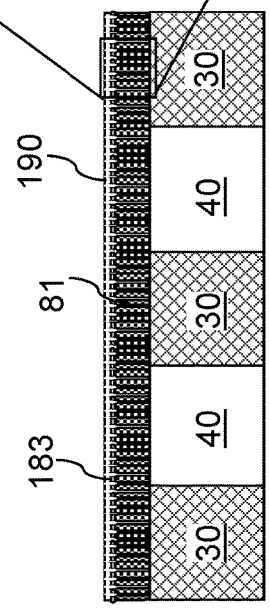
FIG. 7A
FIG. 7B

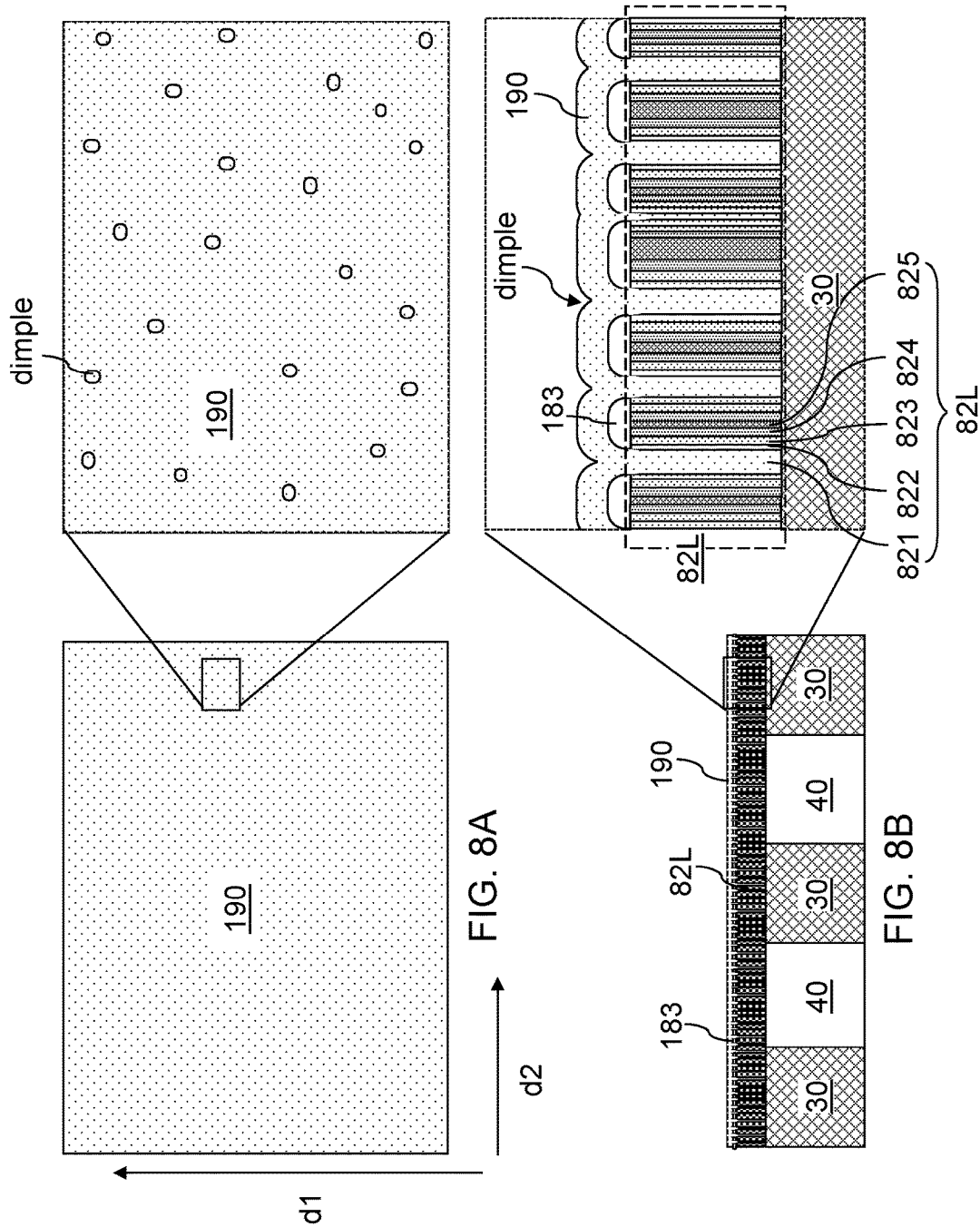

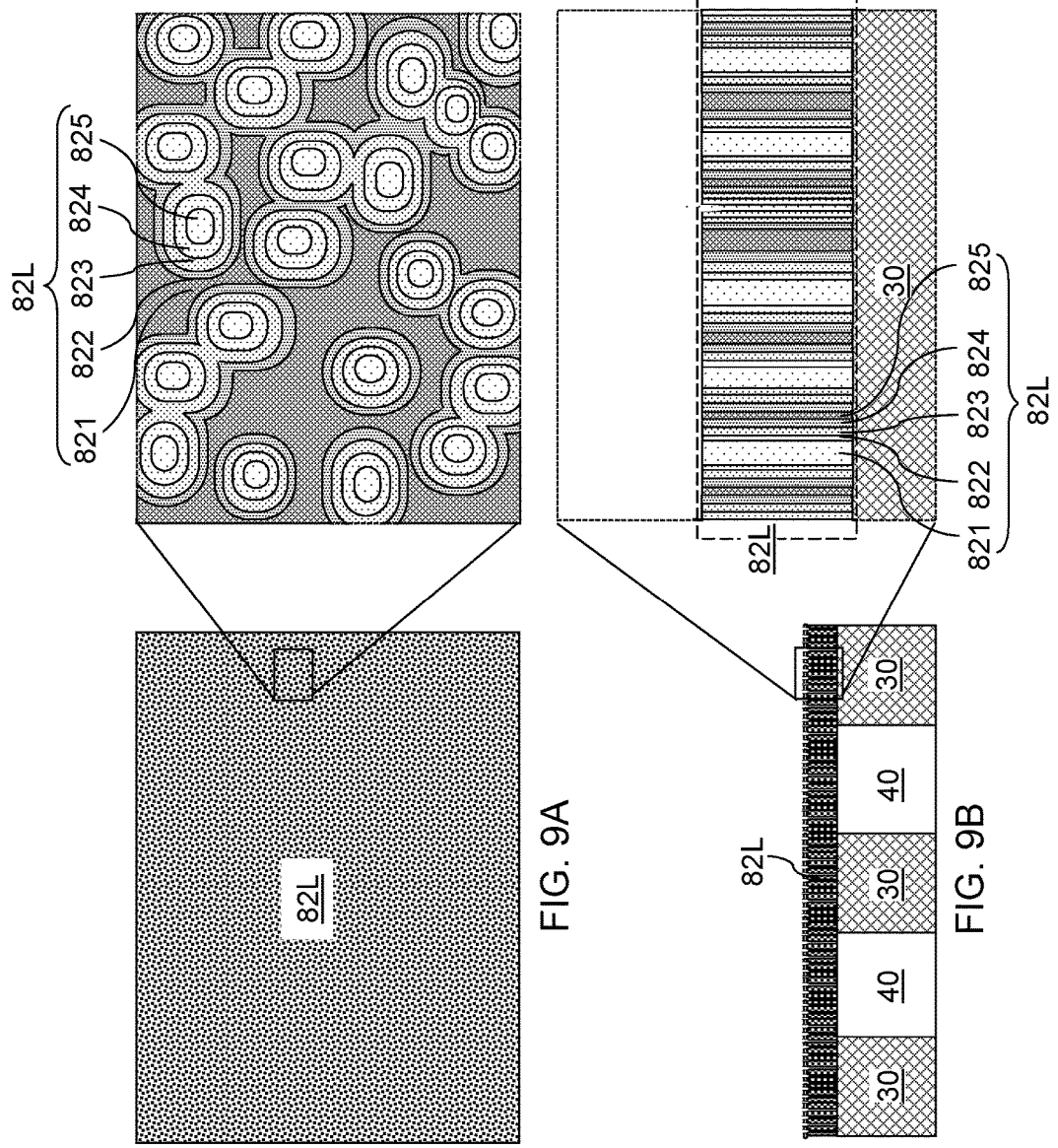

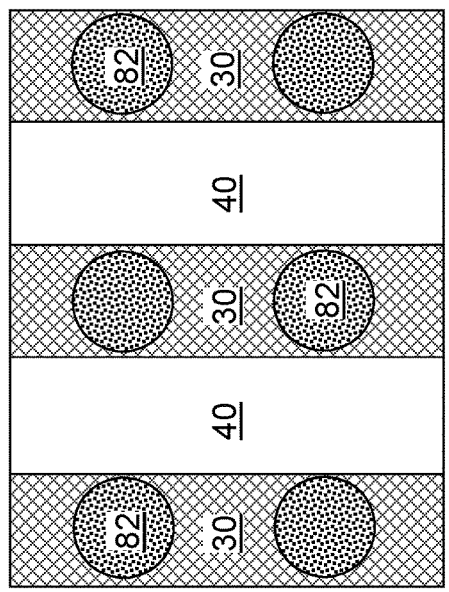
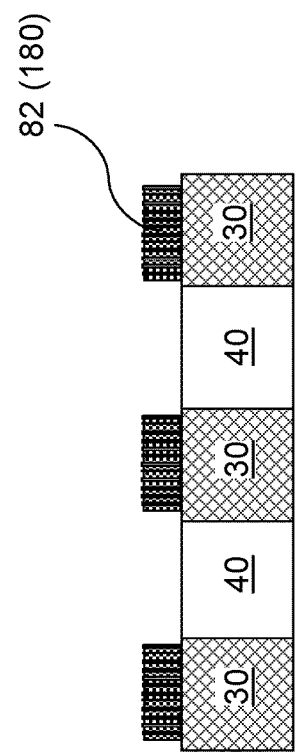
FIG. 10A
FIG. 10B

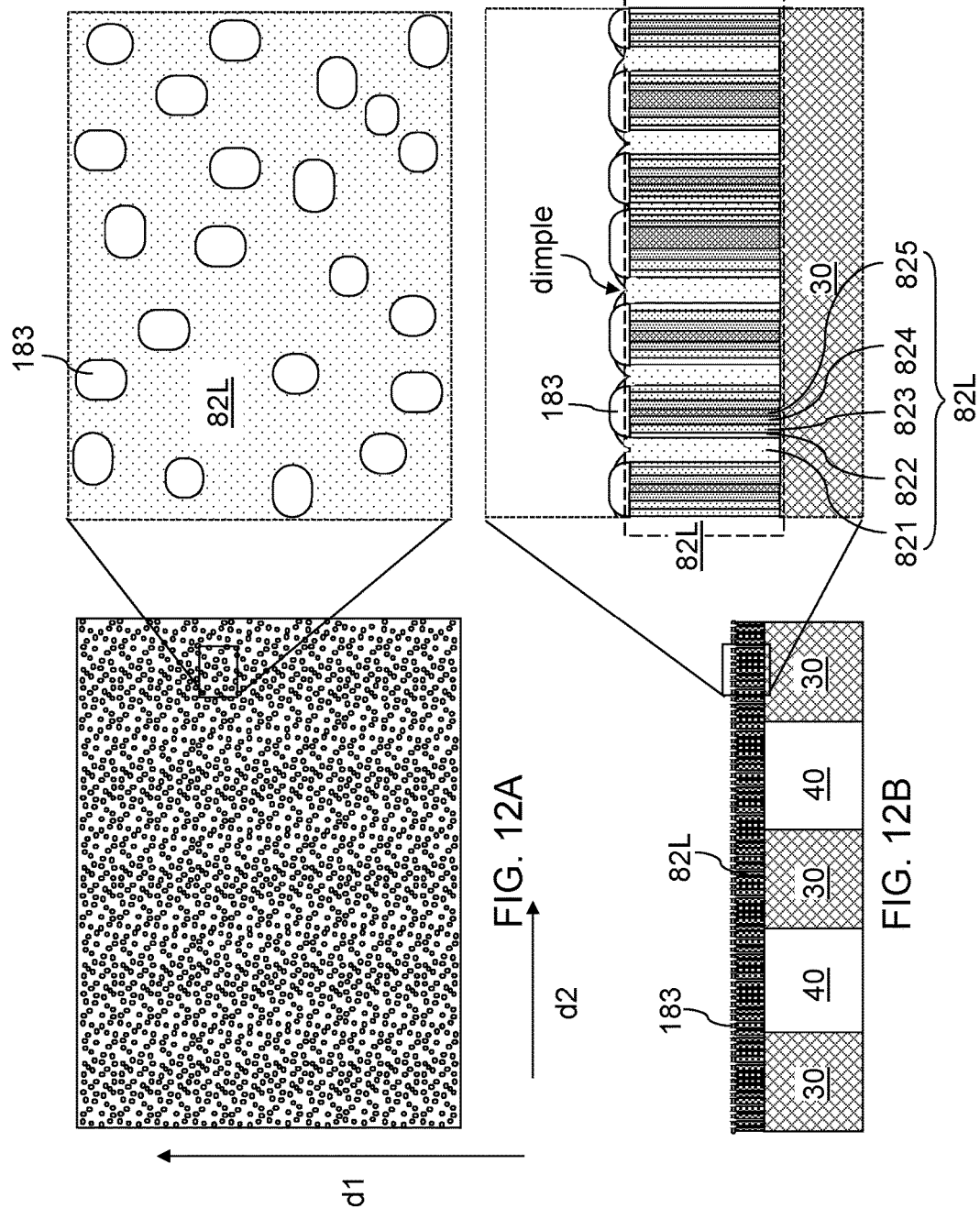

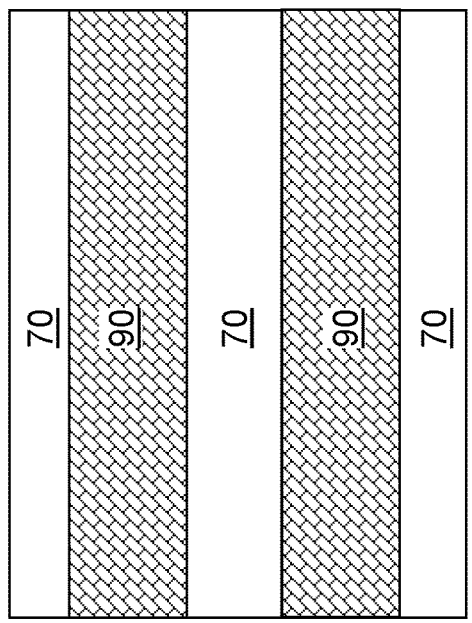
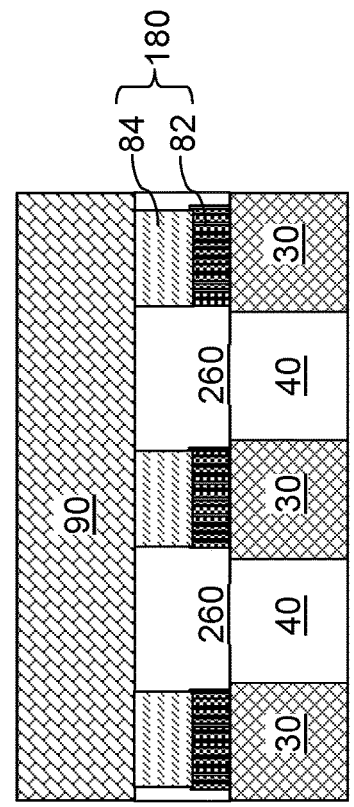

RESISTIVE MEMORY DEVICE CONTAINING OXYGEN-MODULATED HAFNIUM OXIDE MATERIAL AND METHODS OF MAKING THEREOF

FIELD

The present disclosure relates generally to the field of semiconductor devices and specifically to resistive memory devices containing oxygen-modulated hafnium oxide material and methods of manufacturing the same.

BACKGROUND

Resistance Random Access Memory, or "ReRAM," is a non-volatile memory device employing reversible change in resistance in a thin film with application of electrical voltage bias across the film. Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

A resistive memory cell can be programmed into a set state having a low electrical resistance, or a reset state having a high resistance. A write operation stores data in a set of resistive memory cells by programming each resistive memory cell into a set state or a reset state depending on the contents of the data.

SUMMARY

According to an aspect of the present disclosure, a method of forming a resistive memory device comprises forming a first electrode over a substrate, forming hafnium pillars over the first electrode, forming hafnium oxide resistive memory material portions having a lateral compositional modulation in oxygen on the hafnium pillars, and forming a second electrode over the hafnium oxide resistive memory material portions.

According to another aspect of the present disclosure, a resistive memory device includes a first electrode, a second electrode spaced from the first electrode along a spacing direction, and a hafnium oxide resistive material portion of a resistive memory cell located between the first electrode and the second electrode and having a compositional modulation in oxygen concentration within directions that are perpendicular to the spacing direction.

BRIEF DESCRIPTION OF THE DRAWINGS

FIG. 6A is a top-down view of the region of the in-process structure after formation of an array of pillar-shaped openings according to an embodiment of the present disclosure. An inset provides a magnified view.

FIG. 6B is a vertical cross-sectional view of the region of FIG. 6A. An inset provides a magnified view.

FIG. 7A is a top-down view of the region of the in-process structure after formation of a hafnium oxide layer according to an embodiment of the present disclosure. An inset provides a magnified view.

FIG. 7B is a vertical cross-sectional view of the region of FIG. 7A. An inset provides a magnified view.

FIG. 8A is a top-down view of the region of the in-process structure after formation a hafnium oxide layer having a compositional modulation in oxygen concentration according to an embodiment of the present disclosure. An inset provides a magnified view.

FIG. 8B is a vertical cross-sectional view of the region of FIG. 8A. An inset provides a magnified view.

FIG. 9A is a top-down view of the region of the in-process structure after removal of excess portions of deposited hafnium oxide layer and the etch stop nucleation layer according to an embodiment of the present disclosure. An inset provides a magnified view.

FIG. 9B is a vertical cross-sectional view of the region of FIG. 9A. An inset provides a magnified view.

FIG. 10A is a top-down view of the region of the in-process structure after patterning the compositionally modulated hafnium oxide layer into hafnium oxide material portions having pillar shapes according to an embodiment of the present disclosure.

FIG. 10B is a vertical cross-sectional view of the region of FIG. 10A.

FIG. 12A is a top-down view of the region of an alternative in-process structure after formation a hafnium oxide layer having a compositional modulation in oxygen concentration by an oxidation process according to an embodiment of the present disclosure. An inset provides a magnified view.

FIG. 12B is a vertical cross-sectional view of the region of FIG. 12A. An inset provides a magnified view.

FIG. 14A is a top-down view of an alternative exemplary structure that can be incorporated into any of the cross-point resistive memory arrays illustrated in FIGS. 2A-2D according to an embodiment of the present disclosure.

FIG. 14B is a vertical cross-sectional view of the exemplary structure of FIG. 14A.

DETAILED DESCRIPTION

Figure 1:
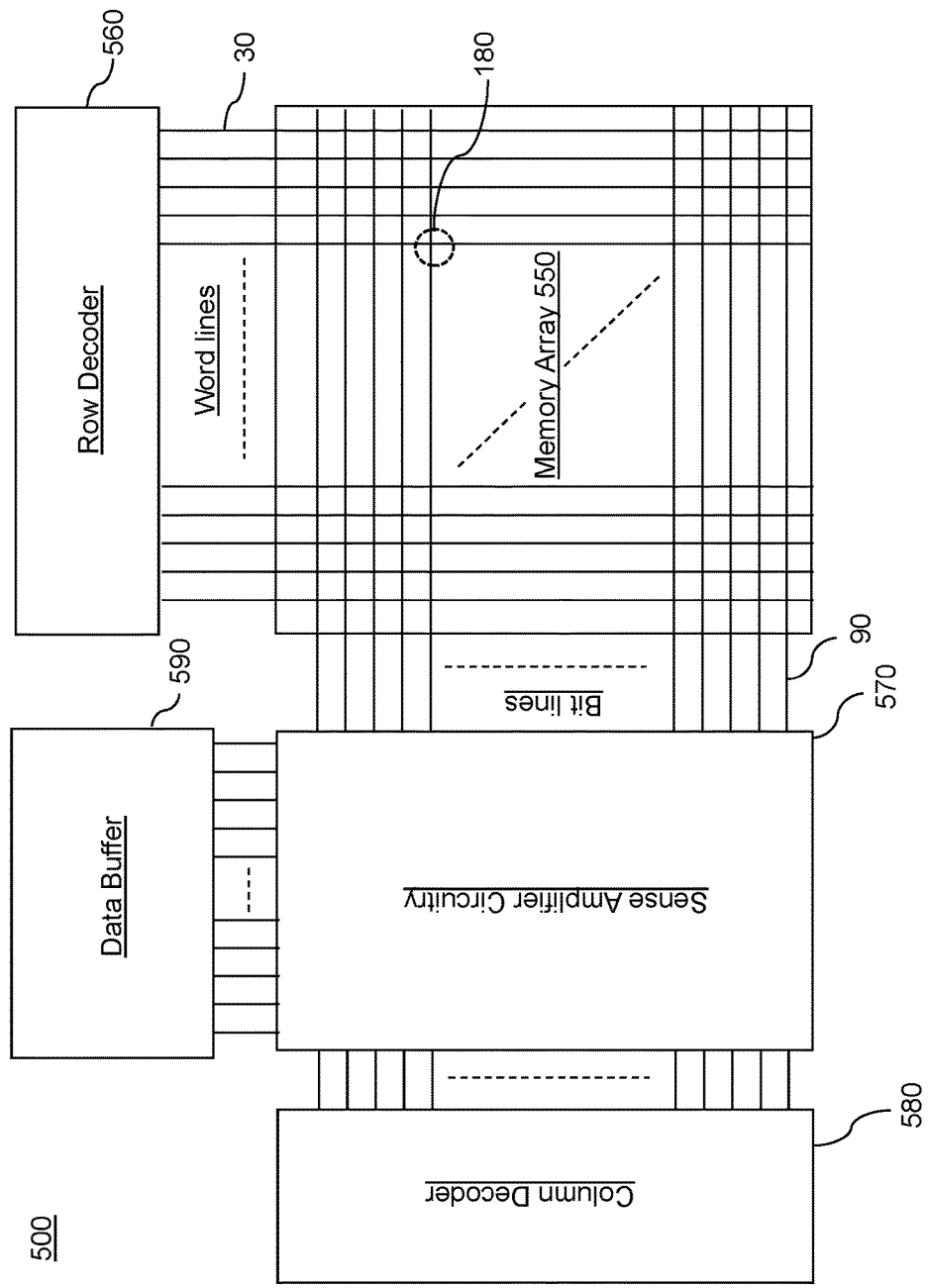
FIG. 1 is a schematic diagram of a memory device including resistive memory cells of the present disclosure in an array configuration.

One type of resistive memory cells employs formation of conductive filaments in hafnium oxide. Programming a resistive memory cell employing hafnium oxide material as resistive memory material portions includes passing of electrical current through the hafnium oxide material. Such programming operations generally use a high voltage. Resistive memory cells that can be programmed with lower programming voltages are desired.

The present disclosure is directed to oxygen-modulated hafnium oxide portions for resistive memory devices and methods of manufacturing the same, the various aspects of which are described below. The embodiments of the disclosure can be employed to form various semiconductor devices such as three-dimensional monolithic memory array devices comprising ReRAM devices. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow. As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" or a "reversibly resistance-switching material" is a material of which the resistivity can be altered by application of a voltage across the material. As used herein, a "resistive memory material layer" refers to a layer including a resistive memory material. As used herein, a "resistive memory material portion" refers to an element that includes a portion of a resistive memory material in a configuration that enables programming of the resistive memory material into at least two states having different values of electrical resistance.

Referring to FIG. 1, a schematic diagram is shown for a non-volatile memory device including non-volatile memory cells of the present disclosure in an array configuration. The non-volatile memory device can be configured as a resistive random access memory device. As used herein, a "random access memory device" refers to a memory device including memory cells that allow random access, i.e., access to any selected memory cell upon a command for reading the contents of the selected memory cell. As used herein, a "resistive random access memory device" refers to a random access memory device in which the memory cells include a resistive memory material portion.

The resistive random access memory device 500 of the present disclosure includes a memory array region 550 containing an array of the respective memory cells 180 located at the intersection of the respective word lines (which may be embodied as first electrically conductive lines 30 as illustrated or as second electrically conductive lines 90 in an alternate configuration) and bit lines (which may be embodied as second electrically conductive lines 90 as illustrated or as first electrically conductive lines 30 in an alternate configuration). The device 500 may also contain a row decoder 560 connected to the word lines, a sense circuitry 570 (e.g., a sense amplifier and other bit line control circuitry) connected to the bit lines, a column decoder 580 connected to the bit lines and a data buffer 590 connected to the sense circuitry. Multiple instances of the resistive memory cells 180 are provided in an array configuration that forms the random access memory device 500. It should be noted that the location and interconnection of elements are schematic and the elements may be arranged in a different configuration.

Each resistive memory cell 180 includes a resistive memory material having at least two different resistive states. The resistive memory material portion is provided between a first electrode and a second electrode within each resistive memory cell 180. As will be described below, the resistive memory material can include a laterally composition-modulated hafnium oxide layer providing at least two different levels of resistivity depending on concentration of conductive filaments therein. The lateral compositional modulation provides locations at which the conductive filaments are formed easily, i.e., under a low voltage bias condition compared to a hafnium oxide layer having a uniform composition throughout.

Figure 2A:
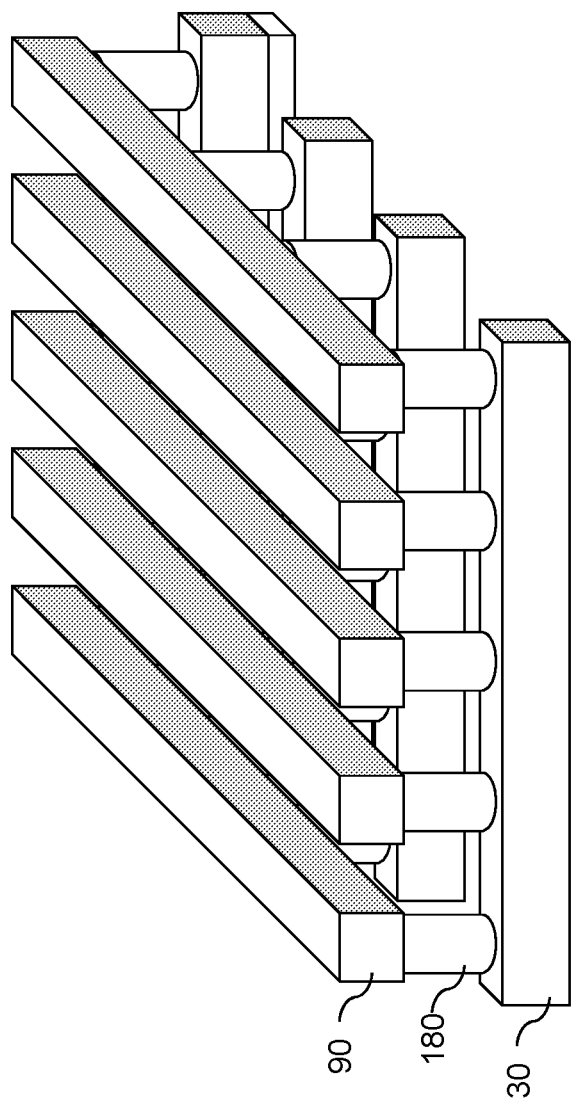
FIGS. 2A-2C illustrate various configurations for a cross-point resistive memory array according to various embodiments of the present disclosure.
Figure 2B:
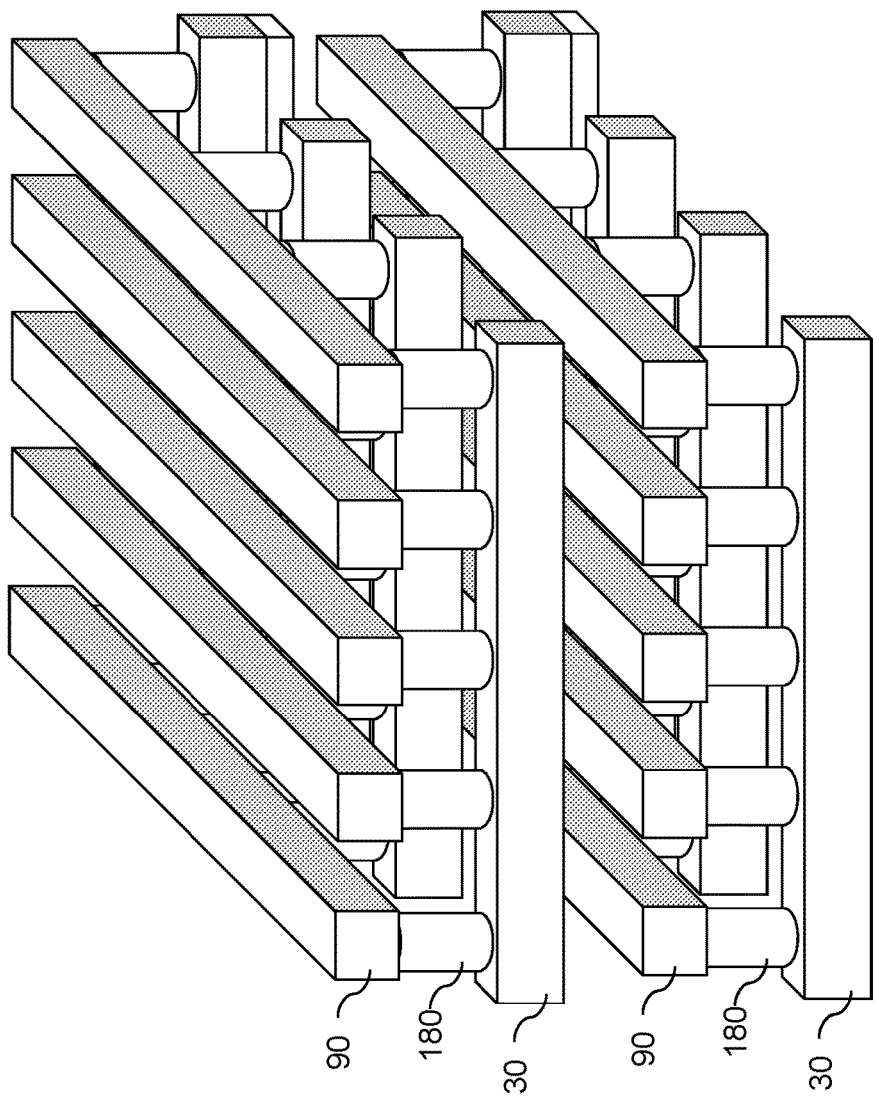
Figure 2C:
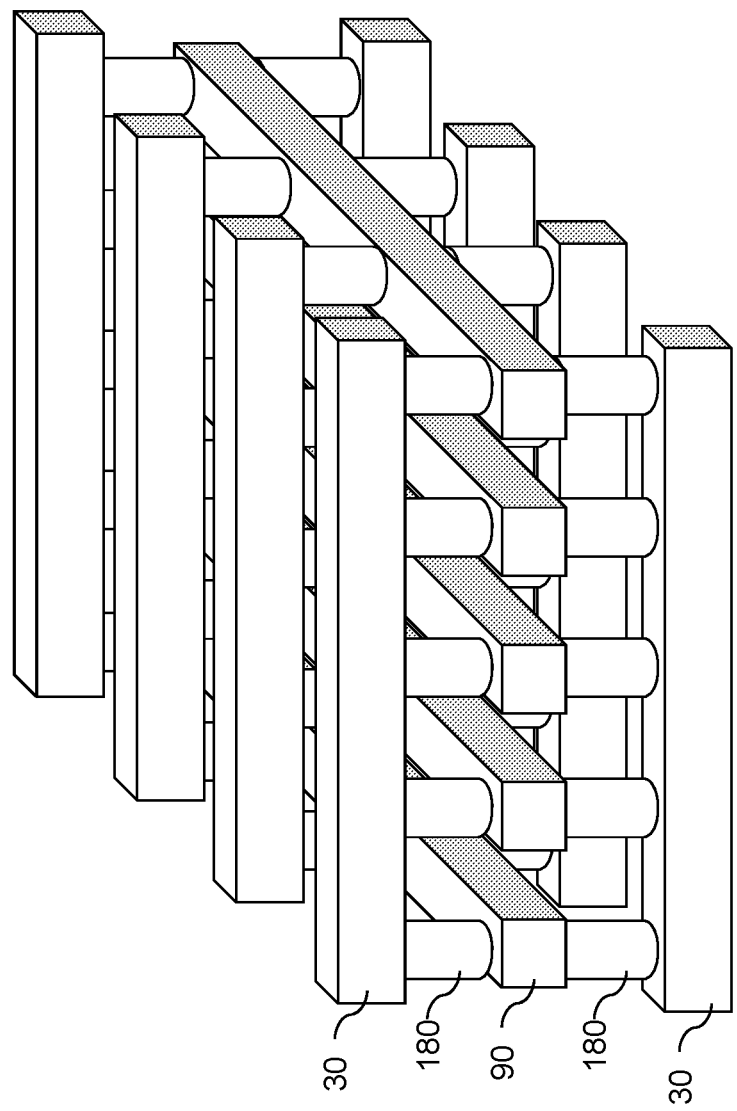
Figure 2D:
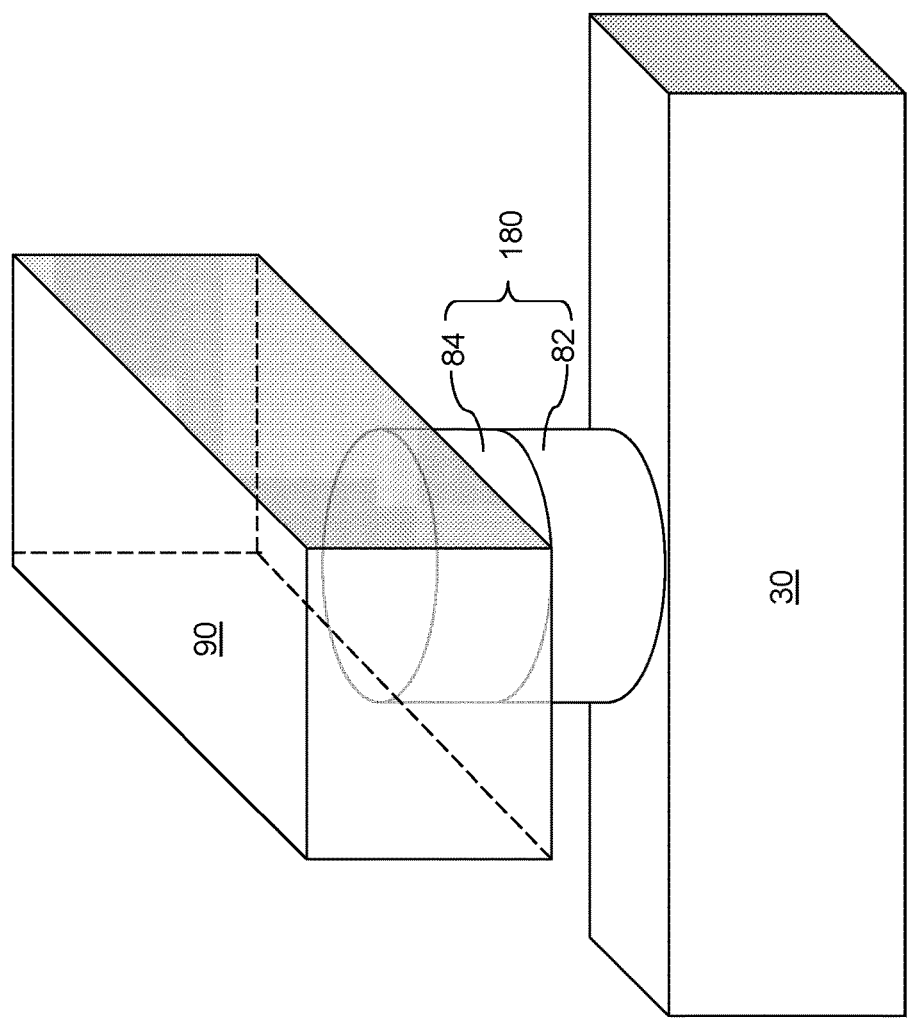
FIG. 2D is a magnified view of an intersection region in any of the cross-point resistive memory arrays of FIGS. 2A-2C.

FIGS. 2A-2C illustrate various configurations for a cross-point resistive memory array according to various embodiments of the present disclosure. FIG. 2D provides a magnified view of an intersection region in any of the cross-point resistive memory arrays of FIGS. 2A-2C. The ReRAM devices illustrated in FIGS. 2A-2D are in cross-point array configurations, and specifically in pillar-cross bar configurations in which first electrically conductive lines 30 and second electrically conductive lines 90 form intersection regions at which their separation distance becomes a minimum, and a resistive memory cell 180 is located at each intersection region. For each resistive memory cell 180, one of the first electrically conductive lines 30 that contacts the restive memory cell 180 is a first electrode (e.g., word line), and one of the second electrically conductive lines 90 that contacts the resistive memory cell 180 is a second electrode (e.g., bit line).

The cross-point resistive arrays of the present disclosure may be provided as a two-dimensional array as illustrated in FIG. 2A, or may be provided as a three-dimensional array as illustrated in FIGS. 2B and 2C that are formed by Monolithically stacking multiple two-dimensional arrays. The first electrically conductive lines 30 and/or the second electrically conductive lines 90 may be shared among vertically neighboring lines as illustrated in FIG. 2C, or not shared among vertically neighboring lines as illustrated in FIG. 2B. If the resistive memory cells 180 include a unidirectional steering element (such as a diode), the polarity of such unidirectional steering element may be suitably selected. For example, the directions of unidirectional steering element are the same in the configuration of FIG. 2B, and alternate from level to level in the configuration of FIG. 2C. For example, as shown in FIG. 2B, each vertical device level may be its own separate word lines 30 and bit lines 90 and the levels may be separated by an insulating layer (not shown for clarity). Alternatively, as shown in FIG. 2C, the device levels may have a mirrored configuration in which adjacent device levels share a set of bit lines or word lines.

The first electrically conductive lines 30 and the second electrically conductive lines 90 intersect in a top-down view. In side views, the first electrically conductive lines 30 and the second electrically conductive lines 90 are vertically offset and are connected by the resistive memory cells 180.

The resistive memory cell 180 can have a pillar structure including a resistive memory material portion 82 and an optional selector (i.e., steering) element 84. Optionally, intermediate conductive material portions (e.g., barrier layers not expressly shown) may be provided between each resistive memory cell 180 and an underlying first electrically conductive line 30, and/or between each resistive memory cell 180 and an overlying second electrically conductive lines 90. Electrode materials such as conductive metal nitrides (e.g., TiN, TaN, and/or WIN) may be employed for such intermediate conductive metal portions, if present.

The sidewalls of the pillar structures of the resistive memory cells 180 can extend along the direction of the spacing between a set of first electrically conductive lines 30 and a set of second electrically conductive lines 90 that function as the first electrodes and the second electrodes for the resistive memory cells 180. In one embodiment, the resistive memory cells 180 between the set of first electrically conductive lines 30 and the set of second electrically conductive lines 90 can be arranged as a two-dimensional periodic array, the set of first electrically conductive lines 30 can be arranged as a one-dimensional periodic array, and the set of second electrically conductive lines 90 can be arranged as a one-dimensional periodic array. The direction that is perpendicular to the top surfaces of the first electrically conductive lines 30, the bottom surfaces of the first electrically conductive lines 30, the top surfaces of the second electrically conductive lines 90, and the bottom surfaces of the second electrically conductive lines 90 is herein referred to as a spacing direction.

In the embodiment shown, the first electrically conductive lines 30 and the second electrically conductive lines 90 are rail-shaped conductors, such as tungsten or other metal conductors, and extend in different directions (e.g., substantially perpendicular to one another). In one embodiment, the first electrically conductive lines 30 and the second electrically conductive lines 90 can have shapes of rectangular parallelepipeds. Alternately, vertical cross-sectional shapes of first electrically conductive lines 30 and the second electrically conductive lines 90 along vertical planes that are perpendicular to the respective lengthwise direction may be inverted trapezoids. Other conductor shapes and/or configurations may be used.

The steering element 84, if employed, includes a material that displays a non-linear voltage-current characteristic such that the steering element 84 is turned off at low external bias voltages, and is turned on (with an insignificant voltage drop thereacross) at high external bias voltages. The threshold voltage for turn-on of the steering element 84 may be in a range from 0.5 V to 5 V, although lesser and greater threshold voltages can also be employed. The steering element 84 may be unidirectional (such as a p-n or p-i-n diode), or may be bidirectional. In one embodiment, the steering element 84 can include amorphous silicon or polysilicon diode, or a volatile conductive bridge comprising amorphous silicon, an amorphous silicon-germanium alloy, a germanium-tellurium alloy, or any other material that can provide a volatile conductive bridge that is activated by an external voltage above a threshold voltage. The material of the steering element 84 may be suitably doped, for example, with As, N, and/or C. In one embodiment, the steering element 84 can include amorphous silicon or polysilicon diode and have a thickness in a range from 2 nm to 10 nm. While the present disclosure is described employing an embodiment, in which the steering element 84 is formed above the resistive memory material portion 82, embodiments are contemplated herein in which the steering element 84 is formed below the resistive memory material portion 82.

According to an aspect of the present disclosure, the resistive memory material portion 82 includes a hafnium oxide material portion having a compositional modulation in oxygen concentration within directions that are perpendicular to the spacing direction. The areas with lower oxygen concentration are prone to formation of oxygen vacancies, and thus, are more likely to form more stable and strong conductive filaments that function as electrically conductive paths upon programming. Hafnium metal areas or hafnium oxide areas with very low oxygen concentration embedded within the hafnium oxide layer remain conductive to provide an enhanced current flow between the electrodes (30, 90) of each cell, such that programming can be performed at a lower voltage. In contrast, hafnium oxide areas with a high oxygen concentration (e.g., stoichiometric or near stoichiometric oxygen concentration) typically provide less stable, weaker conductive filaments which may be broken during a device reading step.

Figure 3A:
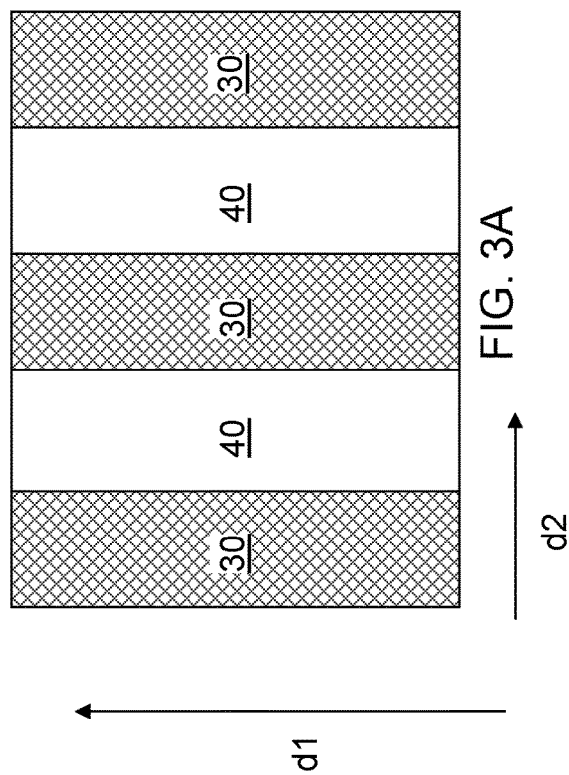
FIG. 3A is a top-down view of a region of an in-process structure for fabrication of any of the cross-point resistive memory arrays illustrated in FIGS. 2A-2D after formation of first electrically conductive lines and first dielectric rail structures according to an embodiment of the present disclosure.
Figure 3B:
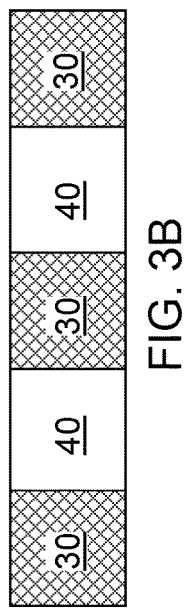
FIG. 3B is a vertical cross-sectional view of the region of FIG. 3A.

Referring to FIGS. 3A and 3B, a region of an in-process structure for fabrication of any of the cross-point resistive memory arrays of FIGS. 2A-2D is illustrated at a processing step after formation of first electrically conductive lines 30 and first dielectric rail structures 40. Each of the first electrically conductive lines 30 includes at least one first conductive material. The at least one first conductive material can be, for example, a stack of a conductive metallic nitride layer (such as a TiN layer) and a metal layer (such as a tungsten layer or a copper layer), or a heavily doped semiconductor material that is conductive. Each of the first electrically conductive lines 30 is a first electrode for a respective set of resistive memory cells 180 to be subsequently formed thereupon. As discussed above, the first electrically conductive lines 30 can be parallel among one another.

Each of the first electrically conductive lines 30 and the first dielectric rail structures 40 can laterally extend along the first direction d1 (which can be a first horizontal direction), and can be laterally spaced among one another along a second direction d2 (which can be a second horizontal direction). In one embodiment, the first electrically conductive lines 30 can be formed by deposition and patterning of at least one first conductive material, and the first dielectric rail structures 40 can be formed by depositing a dielectric material between the first electrically conductive lines 30 and removing excess portions of the dielectric material from above the top surfaces of the first electrically conductive lines 30 by a planarization process (such as chemical mechanical planarization). Alternatively, the first dielectric rail structures 40 can be formed by deposition and patterning of a dielectric material, and the first electrically conductive lines 30 can be formed by depositing at least one first conductive material between the first dielectric rail structures 40 and removing excess portions of the at least one first conductive material from above the top surfaces of the first dielectric rail structures 40 by a planarization process (such as chemical mechanical planarization). The width of each of the first electrically conductive lines 30 and the first dielectric rail structures 40 can be in a range from 16 nm to 150 nm, and the thickness of each of the first electrically conductive lines 30 and the first dielectric rail structures 40 can be in a range from 30 nm to 300 nm, although lesser and greater dimensions can also be employed.

Figure 4A:
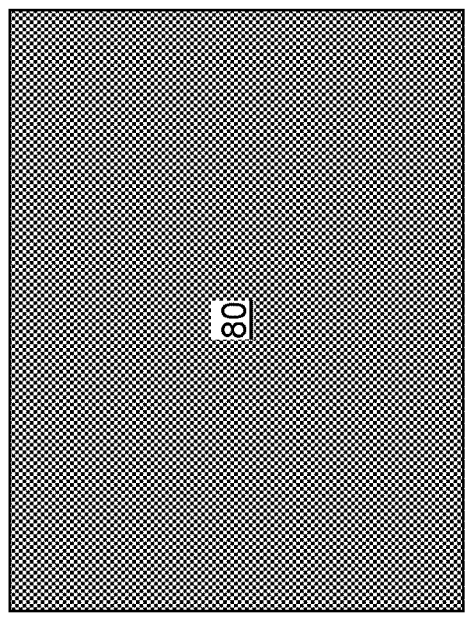
FIG. 4A is a top-down view of the region of the in-process structure after formation of a hafnium layer according to an embodiment of the present disclosure.
Figure 4B:
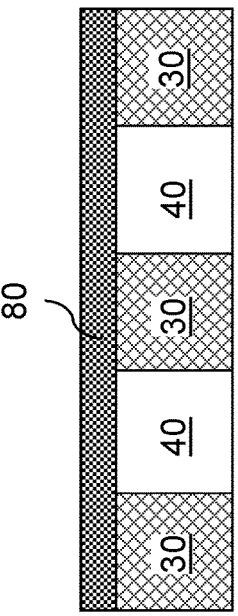
FIG. 4B is a vertical cross-sectional view of the region of FIG. 4A.

Referring to FIGS. 4A and 4B, a hafnium layer 80 can be deposited on the top surfaces of the first electrically conductive lines 30 and the first dielectric rail structures 40. The hafnium layer 80 can consist essentially of hafnium, and can be deposited by a conformal deposition method (such as chemical vapor deposition or atomic layer deposition) or a non-conformal deposition method (such as physical vapor deposition). If selector elements 84 are to be included in each resistive memory cell 180, at least one material layer for forming selector elements 84 can be deposited on the top surfaces of the first electrically conductive lines 30 and the first dielectric rail structures 40 prior to formation of the hafnium layer 80. Thus, the hafnium layer 80 is formed over, and directly or indirectly on, the first electrically conductive lines 30 and the first dielectric rail structures 40. The thickness of the hafnium layer 80 can be in a range from 2 nm to 6 nm (such as from 3 nm to 5 nm), although lesser and greater thicknesses can also be employed.

Figures 5A, 5B:
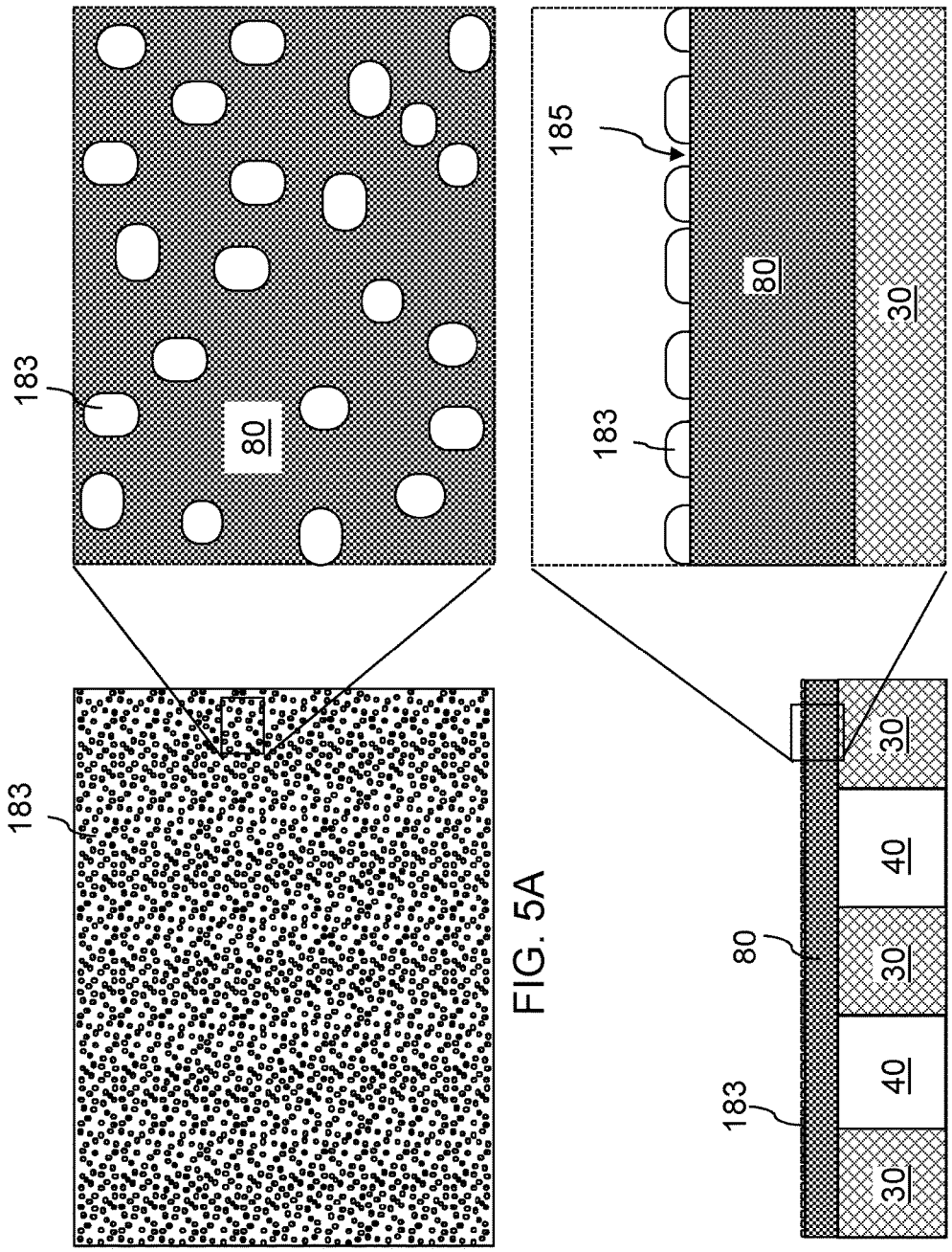
FIG. 5A is a top-down view of the region of the in-process structure after formation of an discrete etch mask islands according to an embodiment of the present disclosure. An inset provides a magnified view.
FIG. 5B is a vertical cross-sectional view of the region of FIG. 5A. An inset provides a magnified view.

Referring to FIGS. 5A and 5B, an discrete etch mask islands 183 is formed directly on the top surface of the hafnium layer 80. The discrete etch mask islands 183 do not cover the entire top surface of the hafnium layer 80, and are subsequently employed as an etch mask. In one embodiment, the discrete etch mask islands 183 includes a material that nucleates in an island growth mode. In other words, the discrete etch mask islands 183 includes a material that does not form a continuous layer until, and unless, the islands of the deposited material coalesce after deposition of enough material that is sufficient to form several monolayers. According to an embodiment of the present disclosure, presence of openings 185 between the discrete etch mask islands 183 is desired. Thus, disposition of the material of the discrete etch mask islands 183 is terminated when the discrete etch mask islands 183 are discontinuous and form discrete islands which cover a fraction of the entire top surface area of the hafnium layer 80 such that the fraction is in a range from 0.2 to 0.8. In one embodiment, the fraction can be in a range from 0.3 to 0.7. In another embodiment, the fraction can be in a range from 0.4 to 0.6. In one embodiment, the coverage of the hafnium layer 80 by the discrete etch mask islands 183 can be such that openings 185 are present in the discrete etch mask islands 183. The average maximum lateral dimensions of the discrete openings 185 in the discrete etch mask islands 183 can be in a range from 0.7 nm to 3 nm, such as from 1 nm to 2 nm, although lesser and greater average maximum lateral dimensions of the discrete openings 185 can also be employed. The average thickness of the discrete etch mask islands 183, as calculated only within areas in which the discrete etch mask islands 183 is present, can be in a range from 0.7 nm to 3 nm, such as from 1 nm to 2 nm, although lesser and greater average thicknesses can also be employed.

Non-limiting examples of materials that nucleate in an island growth mode, and thus, may be employed for the discrete etch mask islands 183, include silicon oxide, silicon nitride, and aluminum oxide. An average distance between neighboring pairs of openings 185 in the discrete etch mask islands 183 may be within a range from 1.5 nm to 6 nm, and/or may be within a range from 2 nm to 4 nm. Portions of the top surface of the hafnium layer 80 can be physically exposed inside each opening 185 in the discrete etch mask islands 183.

In another embodiment, layer with a rough or non-uniform surface may be used as the etch mask. For example, a hemispherical grain polysilicon layer with a bumpy upper surface may be deposited over the hafnium layer 80. This layer is then etched back to leave only discrete islands 183 of polysilicon remaining on the hafnium layer. The 1 to 2 nm thick islands 183 are the residue of the bumps in the original polysilicon layer. The islands 183 are subsequently used as an etch mask.

Referring to FIGS. 6A and 6B, an anisotropic etch process that etches hafnium selective to the material of the discrete etch mask islands 183 can be performed to etch through portions of the hafnium layer 80 that are not masked by the discrete etch mask islands 183. Reactive ion etch processes that etch metal selective to the mask material can be employed for the anisotropic etch process. The anisotropic etch process transfers the pattern of the openings 185 in the discrete etch mask islands 183 through the hafnium layer 80 such that pillar-shaped openings 187 are formed within the hafnium layer 80. Specifically, unmasked portions of the hafnium layer 80 that are not covered by the discrete etch mask islands 183 are etched by the anisotropic etch process that etches hafnium selective to the material of discrete etch mask islands 183 to form hafnium pillars 81.

As used herein, a "pillar-shaped opening" refers to an opening having a shape of a pillar, i.e., an opening of which the horizontal cross-sectional area is substantially independent of the height at which the horizontal cross-section is taken. Thus, the pillar-shaped openings 187 can have substantially vertical sidewalls. It is understood that hafnium atoms may not be vertically aligned in the hafnium pillars 81, and therefore, a "substantially vertical sidewall" of the hafnium pillars 81 can include atomic scale lateral variations due to the variations in the positions of the hafnium atoms in the hafnium pillars 81. Because the pattern of the openings 185 in the discrete etch mask islands 183 can be random, the pattern of the pillar-shaped openings 187 is also random. Thus, a random (i.e., non-periodic) array of pillar-shaped openings 187 is formed through the hafnium layer. Portions of the top surfaces of a first electrically conductive line 30 are physically exposed at the bottom of each pillar-shaped opening 187 that overlies the first electrically conductive line 30. Portions of the top surfaces of a first dielectric rail structure 40 are physically exposed at the bottom of each pillar-shaped opening 187 that overlies the first dielectric rail structure 40.

Referring to FIGS. 7A and 7B, a hafnium oxide layer 190 can be formed on the hafnium pillars 81 in the pillar-shaped openings 187 and over the discrete etch mask islands 183 by a conformal deposition process. For example, an atomic layer deposition (ALD) process that alternately provides a hafnium precursor and an oxidant (such as water vapor, oxygen gas or ozone) can be employed to form the hafnium oxide layer 190. The hafnium oxide layer 190 may include stoichiometric hafnium oxide ($HfO_2$) or non-stoichiometric hafnium oxide ($HfO_{2-\eta}$) in which $0 < \eta \leq 0.3$. The thickness of the hafnium oxide layer 190 is selected such that the entire volume of the pillar-shaped opening 187 can be filled with the hafnium oxide layer 190. Dimples in the top of the hafnium oxide layer 190 may be formed in areas overlying pillar-shaped openings 187 of significant sizes (e.g., above the average size of the pillar-shaped openings 187).

Referring to FIGS. 8A and 8B, an anneal process may be performed at an elevated temperature during, or after, the atomic layer deposition process that forms the hafnium oxide layer 190. In one embodiment, the atomic layer deposition process that forms the hafnium oxide layer 190 can be performed at a temperature greater than 500 degrees Celsius, which may be within a range from 600 degrees Celsius to 800 degrees Celsius. Alternatively or additionally, the exemplary structure may be annealed in an oxidizing ambient (such as an ambient including at least 1 mTorr of water vapor, oxygen gas or ozone) at an elevated temperature in a range from 600 degrees Celsius to 900 degrees Celsius (such as from 700 degrees Celsius to 800 degrees Celsius). The partial pressure of the oxidant gas (such as oxygen gas or ozone) may be in a range from 1 mTorr to 760 Torr.

During the anneal, at least at least part of each of the hafnium pillars 81 (i.e., part of each pillar or the entire pillar) are converted into hafnium oxide portions having a graded oxygen concentrations. In one embodiment, the anneal process may be performed at an elevated temperature after the array of pillar-shaped openings 187 is filled with hafnium oxide layer 190. During the anneal process, oxygen atoms diffuse from the hafnium oxide layer 190 into the underlying hafnium pillars to provide various hafnium oxide regions (821, 822, 823, 824, and optionally 825) having different (e.g., graded) oxygen concentrations.

For example, the pillar-shaped openings 187 may be filled with high oxygen concentration (e.g., near-stoichiometric) hafnium oxide portions 821 of layer 190, which have a composition of $HfO_x$ in which x is in a range from 1.8 to 2.0. Interior portions of the hafnium pillars 81 that are most distal from the pillar-shaped openings 187 comprise low oxygen pillar portions 825, which have a composition of $HfO_x$ in which x is in a range from 0 to 1.2. In other words, portions 825 may comprise hafnium metal or hafnium oxide with a low oxygen concentration. In one embodiment, the range of x for portions 825 may be in a range from 0 to 0.5 or from 0.5 to 1.2, such as from 0.8 to 1.2, although lower values and higher values of x can also be employed. Between each neighboring pair of a low oxygen portion 825 and a high oxygen portion 821, one or more intermediate hafnium oxide portions (822, 823, 824) can be formed with an intermediate oxygen concentration between the high and low oxygen concentrations of respective portions 821 and 825. In an illustrative example, the intermediate hafnium oxide portions (822, 823, 824) can include a first intermediate hafnium oxide portion 822 having a composition of $HfO_x$ in which x is in a range from 1.6 to 1.8, a second intermediate hafnium oxide portion 823 having a composition of $HfO_x$ in which x is in a range from 1.4 to 1.6, and a third intermediate hafnium oxide portion 824 having a composition of $HfO_x$ in which x is in a range from 1.2 to 1.4.

While the present disclosure is described employing five zones of oxygen concentration for the various oxygen concentration of the hafnium oxide material, it is understood that the division of the hafnium oxide material portion into five oxygen concentration zones is arbitrary, and any other integer greater than 1 may be employed to subdivide the graded oxygen concentration ranges of the hafnium oxide material, which have a continuously graded oxygen concentration in the lateral direction. As such, the subdivision of the oxygen concentration of the hafnium oxide material is only illustrative of the lateral variations of the oxygen concentration of the hafnium oxide portions that are formed by deposition of the hafnium oxide material or by conversion of parts or entirety of each of the hafnium pillars 81 into hafnium oxide portions.

The hafnium oxide portions (821, 822, 823, 824, and optionally 825) are formed within, and around, each of the array of pillar-shaped openings 187. The various hafnium oxide portions (821, 822, 823, 824, and optionally 825) collectively constitute a hafnium oxide layer 82L having a compositionally modulated (e.g., laterally graded) oxygen concentration.

In one embodiment, the hafnium oxide layer 82L has a composition of $HfO_x$ in which x is a variable that is greater than 0 and is not greater than 2.0. In one embodiment, x can be within a range from 0.8 to 2.0, such as 1 to less than 2, through the entirety of the hafnium oxide layer 82L. The value of x changes along directions that are perpendicular to the direction of thickness (i.e., the vertical direction) of the hafnium oxide layer 82L, and in one embodiment is substantially invariant along the direction of thickness of the hafnium oxide layer 82L between the two electrodes (30, 90). The absence of any significant variation in the oxygen concentration along the thickness direction of the hafnium oxide layer 82L is because the sidewalls of the pillar-shaped openings 187 are substantially vertical, and therefore, any oxygen concentration gradient within the hafnium oxide layer 82L is along horizontal directions, i.e., within the plane defined by the first direction d1 and the second direction d2.

In one embodiment, the compositional modulation in oxygen concentration is random along directions that are perpendicular to the direction of thickness of the hafnium oxide layer 82L, i.e., within the plane defined by the first and second directions (d1, d2). In one embodiment, the average distance between neighboring pairs of a local peak in oxygen concentration (i.e., a center of the near-stoichiometric hafnium oxide portions 821) and a local valley in oxygen concentration (i.e., a center of a low oxygen pillar portion 825) along the directions that are perpendicular to the spacing direction can be within a range from 1.5 nm to 6 nm, such as from 2 nm to 4 nm.

Referring to FIGS. 9A and 9B, excess portions of deposited hafnium oxide layer 190 and the islands 183 can be removed from above a horizontal plane including plane including the bottom surface of the discrete etch mask islands 183 (which is the plane including the interface between the discrete etch mask islands 183 and the hafnium oxide layer 82L) employing a planarization process. For example, chemical mechanical planarization (CMP) can be performed to remove the excess portions of deposited hafnium oxide layer 190 and the islands 183 from above the hafnium oxide layer 82L.

Referring to FIGS. 10A and 10B, a photoresist layer (not shown) can be applied over the hafnium oxide layer 82L, and can be lithographically patterned to cover discrete areas overlying the first electrically conductive lines 30. The locations of the discrete patterned portions of the photoresist layer can be selected to form a two-dimensional periodic array (such as a rectangular array). An etch process can be performed to transfer the pattern of the photoresist layer through the hafnium oxide layer 82L. The etch process can include an anisotropic etch process (such as a reactive ion etch process), or an isotropic etch process (such as a wet etch process). Each patterned portion of the hafnium oxide layer 82L constitutes a resistive memory material portion 82, which is a discrete portion of a hafnium oxide layer having a lateral modulation in oxygen composition. In one embodiment, each resistive memory material portion 82 can have a circular, elliptical, or polygonal cylindrical shape. In one embodiment, the resistive memory material portion 82 can form a periodic two-dimensional array such as a rectangular array. The portions of the photoresist layer can be subsequently removed, for example, by ashing.

In one embodiment, a resistive memory cell 180 may consist only of the resistive memory material portion 82. If a resistive memory cell 180 includes a selector element and/or intermediate conductive material portions, such additional components can be formed by forming a suitable additional material layer prior to, and/or after, formation of the hafnium oxide layer 82L, and transferring the pattern in the photoresist layer through the additional material layers employing additional etch processes while the photoresist layer is present.

Figure 11A:
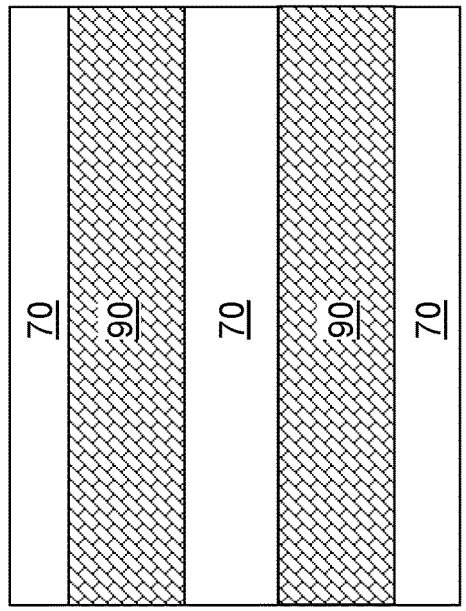
FIG. 11A is a top-down view of an exemplary structure that can be incorporated into any of the cross-point resistive memory arrays illustrated in FIGS. 2A-2D according to an embodiment of the present disclosure.
Figure 11B:
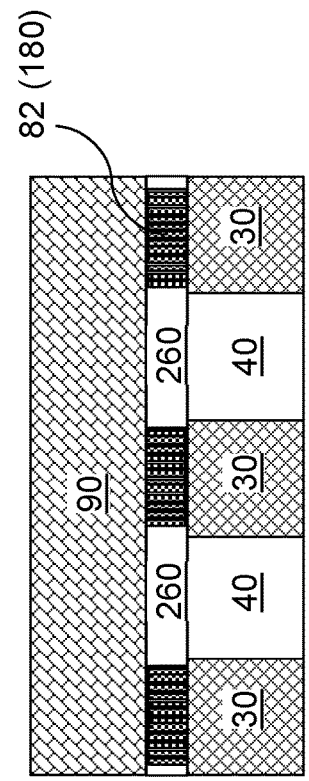
FIG. 11B is a vertical cross-sectional view of the exemplary structure of FIG. 11A.

Referring to FIGS. 11A and 11B, a dielectric material layer can be deposited over the array of resistive memory material portion 82. The dielectric material layer can include a material such as silicon oxide, spin-on-glass, or organosilicate glass. The dielectric material can be subsequently planarized employing the top surfaces of the array of resistive memory material portion 82 as stopping surfaces. For example, chemical mechanical planarization process can be performed to planarize the dielectric material. The remaining portion of the dielectric material layer constitutes an inter-electrode dielectric matrix 260, which includes an array of openings within which the resistive memory material portions 82 are located. The top surface of the inter-electrode dielectric matrix 260 can be coplanar with the top surfaces of the resistive memory material portions 82, and the bottom surface of the inter-electrode dielectric matrix 260 can be coplanar with the bottom surfaces of the resistive memory material portions 82.

Subsequently, second electrically conductive lines 90 and second dielectric rail structures 70 are formed over the array of resistive memory material portions 82 and the inter-electrode dielectric matrix 260. Each of the second electrically conductive lines 90 includes at least one second conductive material. The at least one second conductive material can be, for example, a stack of a conductive metallic nitride layer (such as a TiN layer) and a metal layer (such as a tungsten layer or a copper layer), or a heavily doped semiconductor material that is conductive. Each of the second electrically conductive lines 90 is a second electrode for a respective set of underlying resistive memory cells 180, i.e., the set of resistive memory cells 180 contacted by the second electrically conductive line 90. The second electrically conductive lines 90 can be parallel among one another.

Each of the second electrically conductive lines 90 and the second dielectric rail structures 70 can laterally extend along the second direction d2, and can be laterally spaced among one another along the first direction. In one embodiment, the second electrically conductive lines 90 can be formed by deposition and patterning of at least one second conductive material, and the second dielectric rail structures 70 can be formed by depositing a dielectric material between the second electrically conductive lines 90 and removing excess portions of the dielectric material from above the top surfaces of the second electrically conductive lines 90 by a planarization process (such as chemical mechanical planarization). Alternatively, the second dielectric rail structures 70 can be formed by deposition and patterning of a dielectric material, and the second electrically conductive lines 90 can be formed by depositing at least one second conductive material between the second dielectric rail structures 70 and removing excess portions of the at least one second conductive material from above the top surfaces of the second dielectric rail structures 70 by a planarization process (such as chemical mechanical planarization). The width of each of the second electrically conductive lines 90 and the second dielectric rail structures 70 can be in a range from 16 nm to 150 nm, and the thickness of each of the second electrically conductive lines 90 and the second dielectric rail structures 70 can be in a range from 30 nm to 300 nm, although lesser and greater dimensions can also be employed.

For each resistive memory cell 180, the first electrically conductive line 30 that directly underlies the resistive memory cell 180 is a first electrode, and the second electrically conductive line 90 that directly overlies the resistive memory cell 180 is a second electrode.

FIGS. 12A and 12B illustrate an alternative in-process structure that can be employed in lieu of the in-process structure of FIGS. 7A and 7B. In this case, an oxidation process is performed in lieu of deposition of the hafnium oxide layer 190. The exemplary structure of FIGS. 6A and 6B can be subjected to an oxidizing ambient (such an ambient including oxygen gas or ozone at a partial pressure greater than 1 mTorr) at an elevated temperature. The partial pressure of the oxidant (which can be oxygen gas or ozone) in the oxidizing ambient can be in a range from 1 mTorr to 760 Torr, although lesser and greater oxidant partial pressures can also be employed. The elevated temperature of the oxidation process can be in a range from 550 degrees Celsius to 900 degrees Celsius, and may be in a range from 650 degrees Celsius to 850 degrees Celsius. The duration of the oxidation process at the elevated temperature may be in a range from 10 minutes to 24 hours, although lesser and greater durations can also be employed.

The hafnium pillars 81 separated by the pillar-shaped openings 187 are oxidized in the oxidation process. Oxygen atoms diffuse from the pillar-shaped openings 187 into portions of the hafnium pillars 81 that are spaced apart by from the pillar-shaped openings 187. The diffusion rate of oxygen is controlled such that oxygen gradient is maintained in the hafnium pillars 81 throughout the oxidation process. Thus, compositional modulation in oxygen concentration is present while the hafnium pillars 81 are partially or entirely converted into hafnium oxide portions and the volumes of the array of the pillar-shaped openings 187 are filled with hafnium oxide portions through volume expansion during oxidation of the hafnium pillars 81.

A hafnium oxide layer 82L having a compositional modulation in oxygen concentration along the plane including the first and second directions (d1, d2) by forming hafnium oxide portions (821, 822, 823 824, and optionally 825) on the hafnium pillars within each of the array of pillar-shaped openings 187. The profile of the compositional modulation, i.e., modulation in the oxygen concentration, can be the same as in the hafnium oxide layer 82 illustrated in FIGS. 8A and 8B. Dimples may be present in the portions of the top surface of the hafnium oxide layer 82L that is laterally surrounded by openings in the discrete etch mask islands 183. Unlike the structure illustrated in FIGS. 8A and 8B, hafnium oxide material may not be present on the top surfaces of the discrete etch mask islands 183 in the structure of FIGS. 12A and 12B.

Subsequently, the processing steps of FIGS. 9A and 9B, 10A and 10B, and 11A and 11B can be performed to provide any of the cross-point resistive memory arrays of FIGS. 2A-2C.

Figure 13A:
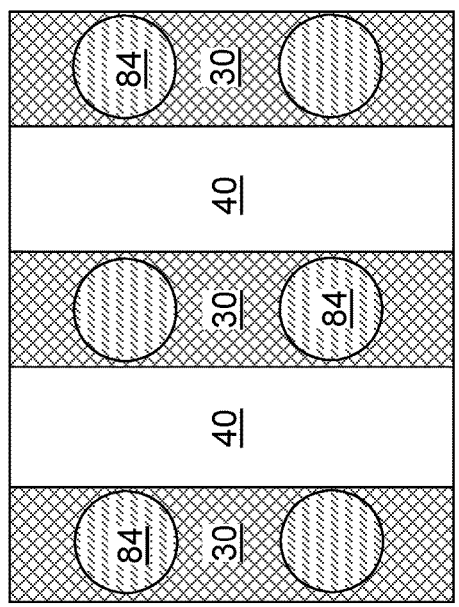
FIG. 13A is a top-down view of the region of an alternative in-process structure after patterning a stack of a compositionally modulated hafnium oxide layer and a selector material layer into pillar structures according to an embodiment of the present disclosure.
Figure 13B:
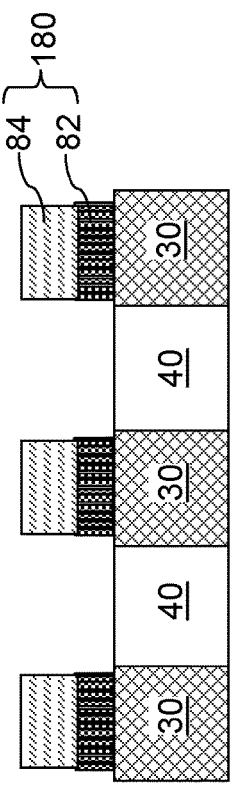
FIG. 13B is a vertical cross-sectional view of the region of FIG. 13A.

Referring to FIGS. 13A and 13B, an alternative in-process structure is illustrated, which is derived from the in-process structure of FIGS. 9A and 9B by depositing one or more selector material layers. The selector material layer can include one or more material layers that can be patterned into a selector element 84. After deposition of the selector material layer, a photoresist layer can be applied and patterned in the same manner as in the processing steps of FIGS. 10A and 10B. The patterned in the photoresist layer can be transferred through the selector material layer and the hafnium oxide layer 82L by at least one etch process, which can include at least one anisotropic etch process and/or at least one isotropic etch process. The patterned portions of the selector material layer constitute the selector elements 84. The patterned portions of the hafnium oxide layer 82L constitutes the resistive memory material portions 82. Each stack of a selector element 84 and a resistive memory material portion 82 can be formed in a pillar configuration, i.e., with a substantially same horizontal cross-sectional shape. The photoresist layer can be subsequently removed, for example, by ashing.

A two-dimensional array of resistive memory cells 180 is formed on the first electrically conductive lines 30. Each resistive memory cell 180 includes a vertical stack of a selector element 84 (as embodied as a selector material portion) and a resistive memory material portion 82 (as embodied as a composition modulated hafnium oxide portion).

Referring to FIGS. 14A and 14B, the processing steps of FIGS. 11A and 11B can be performed to form an inter-electrode dielectric matrix 260, which includes an array of openings within which the resistive memory cells 180 are located. The top surface of the inter-electrode dielectric matrix 260 can be coplanar with the top surfaces of the resistive memory material portions 82, and the bottom surface of the inter-electrode dielectric matrix 260 can be coplanar with the bottom surfaces of the resistive memory material portions 82.

Subsequently, second electrically conductive lines 90 and second dielectric rail structures 70 are formed over the array of resistive memory cells 180 and the inter-electrode dielectric matrix 260. The second electrically conductive lines 90 and second dielectric rail structures 70 can have the same configuration as in FIGS. 11A and 11B.

For each resistive memory cell 180, the first electrically conductive line 30 that directly underlies the resistive memory cell 180 is a first electrode (e.g., word line), and the second electrically conductive line 90 that directly overlies the resistive memory cell 180 is a second electrode (e.g., bit line). A selector material portion, which is a selector element 84, is formed in contact with a portion of the hafnium oxide layer 82L, which is a resistive memory material portion 82. In one embodiment, the selector material portion comprises a semiconductor material, and is disposed between a first electrode (as embodied as an underlying first electrically conductive line 30) and a second electrode (as embodied as an overlying second electrically conductive line 90).

Alternatively, the selector elements 84 can be formed underneath the resistive memory material portions 84 by forming appropriate material layers directly on the top surfaces of the first electrically conductive lines 30 before depositing the hafnium layer 80 and converting the hafnium layer into the hafnium oxide layer 82L. In this case, the hafnium oxide layer 82L and the underlying material layers for the selector elements 84 can be patterned employing the same photoresist layer to form resistive memory cells 180.

The various embodiments of the present disclosure provide a resistive memory device that includes a first electrode 30, a second electrode 90 spaced from the first electrode along a spacing direction, and a hafnium oxide resistive material portion 82 of a resistive memory cell 180 located between the first electrode and the second electrode and having a compositional modulation in oxygen concentration within directions that are perpendicular to the spacing direction. (i.e., within a plane including the first and second directions (d1, d2)).

In one embodiment, the hafnium oxide resistive material portion 82 has a composition of $HfO_x$ in which x is a variable that is greater than 0 and is less than 2.0. In one embodiment, x can be within a range from 0.8 to 1.8 through the entirety of the hafnium oxide material portion 82. In one embodiment, the value of x changes along directions that are perpendicular to the spacing direction and is substantially invariant along the spacing direction.

In one embodiment, the compositional modulation in oxygen concentration can be random along the directions that are perpendicular to the spacing direction. In one embodiment, the average distance between neighboring pairs of a local peak in oxygen concentration and a local valley in oxygen concentration along the directions that are perpendicular to the spacing direction can be within a range from 1.5 nm to 6 nm.

In one embodiment, the first electrode 30 can comprise a first surface that faces the hafnium oxide resistive material portion 82, and the second electrode 90 can comprise a second surface that faces the hafnium oxide material portion 82 and is parallel to the first surface. The spacing direction can be perpendicular to the first surface and the second surface. In one embodiment, a surface of the hafnium oxide material portion 82 can be in contact with one, or both, of the first surface and the second surface.

In one embodiment, a selector 84 can be in contact with the hafnium oxide resistive material portion 82. The selector material portion 84 can comprise a semiconductor material, and disposed between the first electrode 30 and the second electrode 90. The selector 84 and the portion 82 together form a resistive memory cell 180 of a ReRAM device in which electrically conductive filaments are formed through the hafnium oxide resistive memory material portions during programming.

In one embodiment, the resistive memory device can further comprise: first electrically conductive lines 30 that are parallel among one another and extend along a first direction d1 that is perpendicular to the spacing direction, and second electrically conductive lines 90 that are parallel among one another and extend along a second direction d2 that is perpendicular to the spacing direction and different from the first direction d1. One of the first electrically conductive lines 30 can comprise the first electrode for a resistive memory cell 180, one of the second electrically conductive lines 90 can comprise the second electrode for the resistive memory cell 180, and the hafnium oxide material portion 82 can be located at a region at which a distance between the one of the first electrically conductive lines 30 and the one of the second electrically conductive lines 90 is at a minimum.

In one embodiment, the hafnium oxide resistive material portion 82 is pillar-shaped and has a uniform cross-sectional area within planes that are perpendicular to the spacing direction. In one embodiment, the resistive memory device can further comprise additional hafnium oxide resistive material portions 82 located at cross-points at which the first electrically conductive lines 30 and the second electrically conductive lines 90 overlap in a plan view along the spacing direction to provide a two-dimensional resistive memory array, which can be a periodic rectangular two-dimensional resistive memory array. The two-dimensional resistive memory array may be stacked along the spacing direction to provide a three-dimensional resistive memory array.

The resistive memory cell 180 of the present disclosure includes areas of low oxygen concentration within the hafnium oxide resistive material portion 82 due to the lateral oxygen concentration modulation along directions perpendicular to the spacing direction. The regions of low oxygen concentration are prone to generation of a strong conductive filament formed by a connected string of oxygen vacancies between the first electrode and the second electrode. Thus, the resistive memory cell 180 can be programmed and erased employing a lower programming voltage and a lower erase voltage compared to a resistive memory cell of a similar size and including stoichiometric hafnium oxide.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a resistive memory device, comprising:
   forming a first electrode over a substrate;
   forming a hafnium layer over the first electrode;
   forming a random array of pillar-shaped openings through the hafnium layer;
   forming a compositionally modulated hafnium oxide layer having a lateral compositional modulation in oxygen along directions perpendicular to a top surface of the first electrode by diffusing oxygen atoms into the hafnium layer through the random array of pillar-shaped openings, wherein the hafnium layer is converted into hafnium oxide material portions having the lateral compositional modulation; and
   forming a second electrode over a portion of the compositionally modulated hafnium oxide layer.

2. The method of claim 1, further comprising depositing a hafnium oxide material layer into the random array of pillar-shaped openings, wherein the compositionally modulated hafnium oxide layer includes portions of the deposited hafnium oxide material layer.

3. The method of claim 2, further comprising performing an anneal process at an elevated temperature during or after a deposition process that deposits the hafnium oxide material layer, wherein the hafnium layer is converted into hafnium oxide material portions having the lateral compositional modulation during the anneal process.

4. The method of claim 3, wherein the anneal process is performed after the deposition process that deposits the hafnium oxide material layer.

5. The method of claim 3, wherein the anneal process is performed during the deposition process that deposits the hafnium oxide material layer.

6. The method of claim 2, wherein portions of a top surface of the first electrode are physically exposed at a bottom of each pillar-shaped opening that overlies the first electrode.

7. The method of claim 1, further comprising:
   forming discrete etch mask islands on a top surface of the hafnium layer; and
   etching portions of the hafnium layer that are not covered by the discrete etch mask islands, wherein etched volumes of the hafnium layer constitute the random array of pillar-shaped openings.

8. The method of claim 7, further comprising removing the discrete etch mask islands from above a plane including a bottom surface of the discrete etch mask islands employing a chemical mechanical planarization process.

9. The method of claim 1, wherein:
the compositionally modulated hafnium oxide layer has a composition of $HfO_x$ in which $0<x<2$; and
x changes along directions that are perpendicular to a direction of thickness of the compositionally modulated hafnium oxide layer and is substantially invariant along the direction of thickness of the compositionally modulated hafnium oxide layer in a state in which conductive filaments are absent in the compositionally modulated hafnium oxide layer.

10. The method of claim 1, wherein the lateral compositional modulation in oxygen concentration is random along directions that are perpendicular to a direction of thickness of the hafnium oxide resistive memory material portions.

11. The method of claim 1, wherein the lateral compositional modulation in oxygen concentration is graded along directions that are perpendicular to a direction of thickness of the hafnium oxide resistive memory material portions.

12. The method of claim 11, wherein an average distance between neighboring pairs of a local peak in oxygen concentration and a local valley in oxygen concentration along the directions that are perpendicular to a spacing direction between the first electrode and the second electrode is within a range from 1.5 nm to 6 nm.

13. The method of claim 1, further comprising forming a selector in contact with the portion of the compositionally modulated hafnium oxide layer, wherein the selector and the portion of the compositionally modulated hafnium oxide layer form a resistive memory cell of a ReRAM device in which electrically conductive filaments are formed through the portion of the compositionally modulated hafnium oxide layer during programming.

14. The method of claim 6, wherein the discrete etch mask islands do not cover an entire top surface area of the hafnium layer.

15. The method of claim 14, wherein the discrete etch mask islands include a material that nucleates in an island growth mode and does not form a continuous layer until coalescence of islands after formation of multiple monolayers.

16. The method of claim 14, wherein the discrete etch mask islands cover a fraction of the entire top surface area of the hafnium layer such that the fraction is in a range from 0.2 to 0.8.

17. The method of claim 2, further comprising removing a horizontal portion of the deposited hafnium oxide material layer that is formed above a top surface of the hafnium layer.

18. The method of claim 6, wherein the deposited hafnium oxide material layer is deposited directly the physically exposed portions of the top surface of the first electrode at the bottom of each pillar-shaped opening.

19. The method of claim 1, wherein each pillar-shaped opening of the random array of pillar-shaped openings has a substantially vertical sidewall that extends to a top surface of the first electrode.

20. The method of claim 1, wherein the compositionally modulated hafnium oxide layer is free of conductive filaments therein upon formation.

21. The method of claim 1, wherein the compositionally modulated hafnium oxide layer consists essentially of hafnium oxide having oxygen modulation and does not include a material other than hafnium oxide between a top surface thereof and a bottom surface thereof.

* * * * *